(12) United States Patent
Yen et al.

(10) Patent No.: US 9,875,961 B2
(45) Date of Patent: Jan. 23, 2018

(54) STRUCTURE OF INTEGRATED INDUCTOR

(71) Applicant: REALTEK SEMICONDUCTOR CORPORATION, Hsinchu (TW)

(72) Inventors: Hsiao-Tsung Yen, Hsinchu (TW); Yuh-Sheng Jean, Hsinchu County (TW); Ta-Hsun Yeh, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 15/212,789

(22) Filed: Jul. 18, 2016

(65) Prior Publication Data

US 2016/0329281 A1  Nov. 10, 2016

Related U.S. Application Data

(62) Division of application No. 14/720,301, filed on May 22, 2015.

(30) Foreign Application Priority Data

Oct. 6, 2014  (TW) .............................. 103134815 A

(51) Int. Cl.
 *H01L 23/00* (2006.01)
 *H01L 23/522* (2006.01)
 (Continued)

(52) U.S. Cl.
 CPC ..... *H01L 23/5227* (2013.01); *H01F 17/0006* (2013.01); *H01F 17/0013* (2013.01); *H01F 27/2804* (2013.01); *H01L 23/481* (2013.01); *H01L 23/528* (2013.01); *H01L 23/645* (2013.01); *H01L 24/16* (2013.01); *H01L 25/065* (2013.01); *H01L 25/0657* (2013.01);
 (Continued)

(58) Field of Classification Search
 CPC ................... H01L 28/10; H01L 23/645; H01L 2924/19042
 See application file for complete search history.

(56) References Cited

U.S. PATENT DOCUMENTS 6,097,273 A  8/2000  Frye et al.
6,429,504 B1  8/2002  Beaussart et al.
(Continued)

FOREIGN PATENT DOCUMENTS

TW  200721209  6/2007
TW  200816381  4/2008

*Primary Examiner* — Ngan Ngo
(74) *Attorney, Agent, or Firm* — WPAT, PC

(57) ABSTRACT

This invention discloses a structure of an integrated inductor, comprising: an outer metal segment which comprises a first metal sub-segment and a second metal sub-segment; an inner metal segment which is arranged inside an area surrounded by the outer metal segment and comprises a third metal sub-segment and a fourth metal sub-segment; and at least a connecting structure for connecting the outer metal segment and the inner metal segment. The first metal sub-segment corresponds to the third metal sub-segment, and the first metal sub-segment and the third metal sub-segment belong to different metal layers in a semiconductor structure. The second metal sub-segment corresponds to the fourth metal sub-segment, and the second metal sub-segment and the fourth metal sub-segment belong to different metal layers in a semiconductor structure.

8 Claims, 12 Drawing Sheets

(51) Int. Cl.
  *H01L 49/02* (2006.01)
  *H01F 27/28* (2006.01)
  *H01L 23/64* (2006.01)
  *H01F 17/00* (2006.01)
  *H01L 25/065* (2006.01)
  *H01L 23/48* (2006.01)
  *H01L 23/528* (2006.01)

(52) U.S. Cl.
  CPC ...... *H01L 28/10* (2013.01); *H01F 2027/2809* (2013.01); *H01L 2224/16148* (2013.01); *H01L 2225/06513* (2013.01); *H01L 2225/06541* (2013.01); *H01L 2924/0002* (2013.01); *H01L 2924/14211* (2013.01); *H01L 2924/19011* (2013.01); *H01L 2924/19042* (2013.01); *H01L 2924/30107* (2013.01)

(56) References Cited

U.S. PATENT DOCUMENTS

| | | | |
|---|---|---|---|
| 7,355,264 | B2 | 4/2008 | Degani |
| 8,325,001 | B2 | 12/2012 | Huang et al. |
| 2005/0099241 | A1 | 5/2005 | Ezzeddine |
| 2005/0128041 | A1 | 6/2005 | Kim et al. |
| 2006/0284718 | A1 | 12/2006 | Baumgartner et al. |
| 2011/0291232 | A1 | 12/2011 | Yen et al. |
| 2013/0199028 | A1 | 8/2013 | Singh et al. |
| 2015/0364417 | A1* | 12/2015 | Lee ............ H01L 23/5227 257/531 |
| 2016/0035670 | A1* | 2/2016 | Chen ............ H01L 25/16 257/531 |

\* cited by examiner

STRUCTURE OF INTEGRATED INDUCTOR

BACKGROUND OF THE INVENTION

1. Field of the Invention

The present invention relates to a structure of an integrated inductor, especially to a structure of an integrated inductor that provides a high quality factor Q, a large bandwidth, and good symmetry.

2. Description of Related Art

An on-chip inductor is a kind of integrated inductor structure, which is usually of a spiral shape. FIG. 1 illustrates a conventional asymmetric spiral inductor. The asymmetric spiral inductor 100 includes a spiral-shaped metal segment 110 (in light gray color) and a metal segment 120 (in dark gray color). The metal segment 110 and the metal segment 120 are disposed on different layers in a semiconductor structure; for example the metal segment 110 is on the upper layer and the metal segment 120 is on the lower layer, as shown in FIG. 1. The metal segment 110 and the metal segment 120 are connected via a connecting structure 130, which can be a via structure in a semiconductor manufacturing process. FIG. 2 is a cross section of the asymmetric spiral inductor 100 in FIG. 1. The lowermost layer is a substrate 210 and on top of the substrate 210 is an oxide layer 220. The metal segment 120 is contained in the oxide layer 220 while the metal segment 110 is on top of the oxide layer 220. The connecting structure 130, which is made up of a via array, forms a plurality of via holes on the surface of the oxide layer 220 and connect the metal segment 110 and the metal segment 120. In general, the metal segment 120 is made on an ultra-thick metal (UTM) layer, which is usually made of copper and is the upmost metal layer of the oxide layer 220, whereas the metal segment 110 is made on the re-distribution layer (RDL), which is usually made of aluminum-copper alloy and is on top of the oxide layer 220. Specifically, the oxide layer 220 is a protection layer formed in a passivation process of semiconductor manufacture and is usually made of SiO2 or SiN3.

The number of turns of the metal segment 110 is 3, and can be increased to enhance the inductance of the asymmetric spiral inductor 100. The increase in the number of turns results in an increase in the area of the asymmetric spiral inductor 100, and in an increase in the parasitic series resistance and the parasitic capacitance of the asymmetric spiral inductor 100 as well, which decrease the self-resonant frequency and the quality factor Q. In addition, metal loss and substrate loss are also key factors to the quality factor Q. The metal loss arises from resistance of the metal itself while the substrate loss arises from two situations. One is caused by a time-varying electric displacement between the metal coil of the inductor and the substrate as the inductor is functioning. The time-varying electric displacement causes a displacement current between the metal coil and the substrate that penetrates into the low-impedance substrate and in turn causes energy loss. The magnitude of the displacement current is related to the area of the inductor; the bigger the area, the higher the displacement current. The other is caused by a tune-varying electromagnetic field of the inductor that penetrates through a dielectric layer and causes a magnetically induced eddy current in the substrate, which flows in a direction opposite to the current direction in the inductor and thus causes energy loss.

A center tap of the inductor is hard to decide because of the asymmetric structure of the asymmetric spiral inductor. Moreover, the asymmetric spiral inductor is impractical for being used as a passive component in a differential circuit because positions of the inductive center, the capacitive center and the resistive center are different. FIG. 3 shows a conventional symmetric spiral inductor. The symmetric spiral inductor 300 can be roughly divided into an outer part and an inner part. The metal segment 310 includes the left portion of the outer part and the entire inner part; the metal segment 330 includes the right portion of the outer part. The metal segment 310 and the metal segment 330 belong to the same metal layer in the structure (in dark gray color) and are connected by a bridging metal segment 320 of another metal layer (in light gray color). The center of the inner part is connected to a center tap 340, which is on a layer different from the metal segments 310 and 330 and the bridging metal segment 320. A connecting structure 350, a connecting structure 360 and a connecting structure 370 respectively connects the metal segment 310 and the bridging metal segment 320, the bridging metal segment 320 and the metal segment 330, and the metal segment 310 and the center tap 340. The connecting structures can be implemented by vias. Since the symmetric spiral inductor 300 is symmetric in structure, its center tap 340 is easy to decide. Two inductors are respectively defined by the terminal 342 of the center tap 340 and the terminal 312 of the metal segment 310 as well as by the terminal 342 of the center tap 340 and the terminal 332 of the metal segment 330. Ideally, these two inductors have similar inductance, but a practical analysis of the current path of each inductor renders an unideal consequence. A current from the terminal 332 to the center tap 340 (dashed line) flows sequentially through the right portion of the outer part (i.e., the metal segment 330), the connecting structure 360, the bridging metal segment 320, the connecting structure 350 and the left portion of the inner part; on the other hand, the current from the terminal 312 to the center tap 340 flows through only the left portion of the outer part and the right portion of the inner part. Generally, resistances of different metal layers are not the same and the connecting structure also increases the resistance, which accounts for differences in the inductances of the two inductors. When the two inductors are being used as the inductor 410 and the inductor 420 of the VCO (voltage controlled oscillator) in FIG. 4, asymmetric inductances may cause common mode phenomenon in this differential circuit, which affects the stability of the circuit.

In addition, a metal loss of an inductor operating in a low frequency arises from the series resistance of the metal coil when the current in the metal coil has a uniform distribution. When the inductor operates at a high frequency, the inner metal coil generates a high magnetic field, which induces an eddy current inside the metal coil that causes the skin effect phenomenon. Under the skin effect phenomenon, most current is pushed to the surface of the metal coil by the eddy current, which results in uneven current distribution and in turn degrades the quality factor Q because the current encounters a greater resistance as flowing through a smaller cross section of the metal.

SUMMARY OF THE INVENTION

In view of the problems of the prior art, an object of the present invention is to provide a spiral integrated inductor structure that provides a high quality factor Q, a large bandwidth, and good symmetry, so as to make an improvement to the prior art.

The present invention discloses an integrated inductor structure, which comprises an outer metal segment, an inner metal segment arranged in an area surrounded by the outer metal segment, at least a bridging metal segment for connecting the outer metal segment and the inner metal segment, and at least a connecting structure for connecting the bridging metal segment and the outer metal segment or the inner metal segment. The outer metal segment and the inner metal segment are on different metal layers of a semiconductor structure.

The present invention also discloses an integrated inductor structure, which comprises an outer metal segment, an inner metal segment, and at least a connecting structure. The outer metal segment comprises a first metal sub-segment and a second metal sub-segment. The inner metal segment is arranged in an area surrounded by the outer metal segment and comprises a third metal sub-segment and a fourth metal sub-segment. The connecting structure connects the outer metal segment and the inner metal segment. The first metal sub-segment and the third metal sub-segment correspond to each other and belong to different metal layers of a semiconductor structure, and the second metal sub-segment and the fourth metal sub-segment correspond to each other and belong to different metal layers of the semiconductor structure.

The present invention further discloses an integrated inductor structure, which comprises a first spiral inductor and a second spiral inductor connected to the first spiral inductor. Corresponding metal sub-segments of an outer metal segment and an inner metal segment in the first spiral inductor or the second spiral inductor belong to different metal layers in a semiconductor structure.

The integrated inductor structure of this invention effectively reduces parasitic capacitances among metal segments as well as those between the metal segments and the substrate to improve the quality factor Q and the bandwidth of the integrated inductor. The effects of this invention can be better appreciated as the manufacture becomes more advanced with smaller chip sizes. Furthermore, this invention also enhances the degree of symmetry of the symmetric spiral inductor so that the symmetric spiral inductor of this invention is more suitable for passive components in a differential circuit.

These and other objectives of the present invention no doubt becomes obvious to those of ordinary skill in the art after reading the following detailed description of the preferred embodiments that are illustrated in the various figures and drawings.

DETAILED DESCRIPTION OF THE EMBODIMENTS

The following description is written by referring to terms of this technical field. If any term is defined in this specification, such term should be explained accordingly. In addition, the connection between objects or events in the below-described embodiments can be direct or indirect provided that these embodiments are practicable under such connection. Said "indirect" means that an intermediate object or a physical space exists between the objects.

Figure 4:
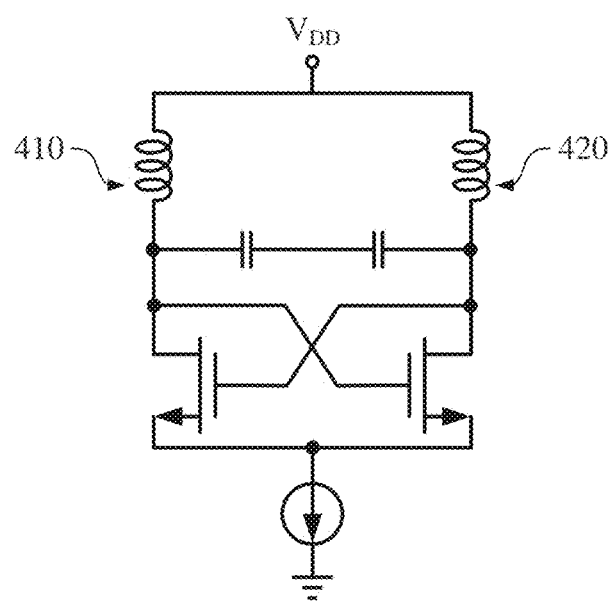
FIG. 4 illustrates a conventional VCO.
Figure 5:
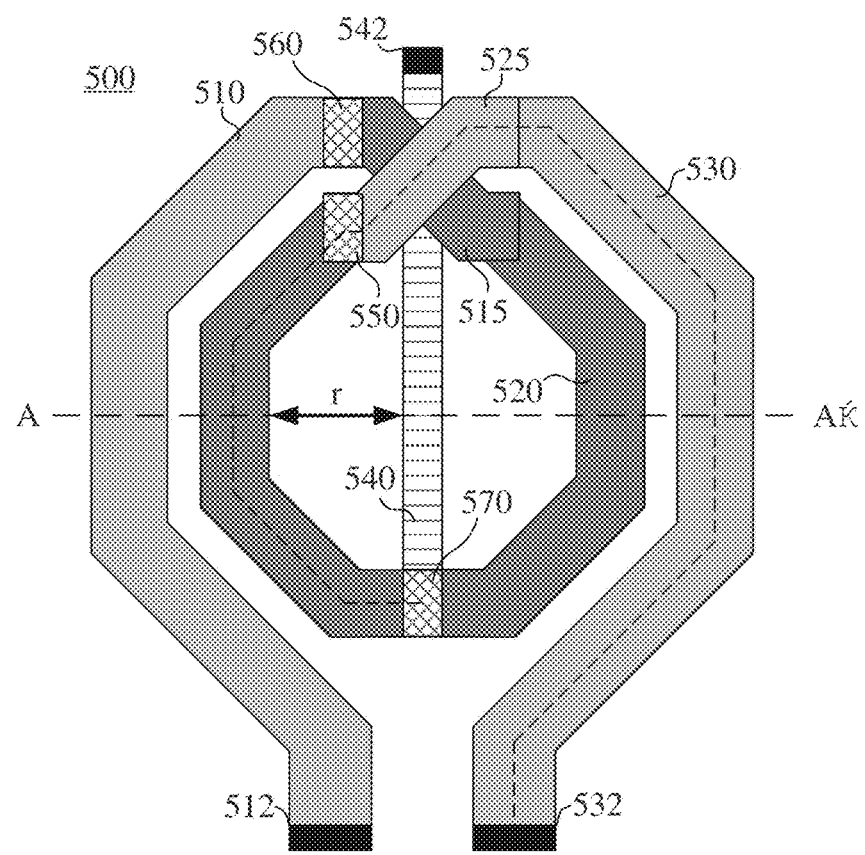
FIG. 5 illustrates a symmetric spiral inductor 500 according to an embodiment of the present invention.

FIG. 5 shows a symmetric spiral inductor 500 according to an embodiment of the present invention. The symmetric spiral inductor 500 includes an outer metal segment made up of a metal segment 510 and a metal segment 530, an inner metal segment made up of a metal segment 520, and bridging metal segments 515 and 525. The outer metal segment and the inner metal segment are respectively formed by a metal segment of an octagon shape, and the inner metal segment is disposed in an area surrounded by the outer metal segment. The bridging metal segment 515 and the bridging metal segment 525, which connect the outer metal segment and the inner metal segment, belong to different metal layers in the semiconductor structure and are partially overlapped but not contact. A terminal of the bridging metal segment 515 connects a metal segment 510 on a different layer through a connecting structure 560, and the other connects the metal segment 520 on the same layer directly. Under some circumstances, the bridging metal segment 515 can be deemed as a part of the metal segment 520; in this specification, however, the bridging metal segment 515 and the metal segment 520 are defined to be distinct from each other in order to describe this invention more explicitly. Likewise, a terminal of the bridging metal segment 525 connects a metal segment 520 on a different layer through a connecting structure 550, and the other connects the metal segment 530 on the same layer directly. Under some circumstances, the bridging metal segment 525 can be deemed as a part of the metal segment 530; in the specification, however, the bridging metal segment 525 and the metal segment 530 are defined to be distinct from each other in order to describe this invention more explicitly. In addition, the symmetric spiral inductor 500 further includes a third connecting structure 570 that connects the metal segment 520 and the center tap 540. As shown in FIG. 5, the current from the terminal 532 to the center tap 540 (dashed line) flows sequentially through the metal segment 530, the bridging metal segment 525, the connecting structure 550 and the left portion of the metal segment 520; in contrast, the current from the terminal 512 to the center tap 540 flows sequentially through the metal segment 510, the connecting structure 560, the bridging metal segment 515, and the right portion of the metal segment 520. It is apparent that the two inductors of the symmetric spiral inductor 500 are symmetric to each other and therefore can be used for differential circuits, such as being used as the inductor 410 and the inductor 420 of the VCO in FIG. 4, to prevent common mode and thus improves circuit stability. In one embodiment of this invention, the outer metal segment of the symmetric spiral inductor 500 (i.e., the metal segment 510 and the metal segment 530) is made of the RDL while the inner segment (i.e., the metal segments 520) is made of the UTM layer. The thickness of the UTM layer is generally greater than that of the RDL, which helps reduce the resistance of the inner metal segment when the inner metal segment is made of the thicker metal layer. As mentioned in the prior art, because the inner part of the integrated inductor structure is subject to the skin effect more easily than the outer part, the quality factor Q of the inductor can be improved by making the resistance of the metal segment 520 smaller than the resistances of the metal segment 510 and the metal segment 530.

Figure 1:
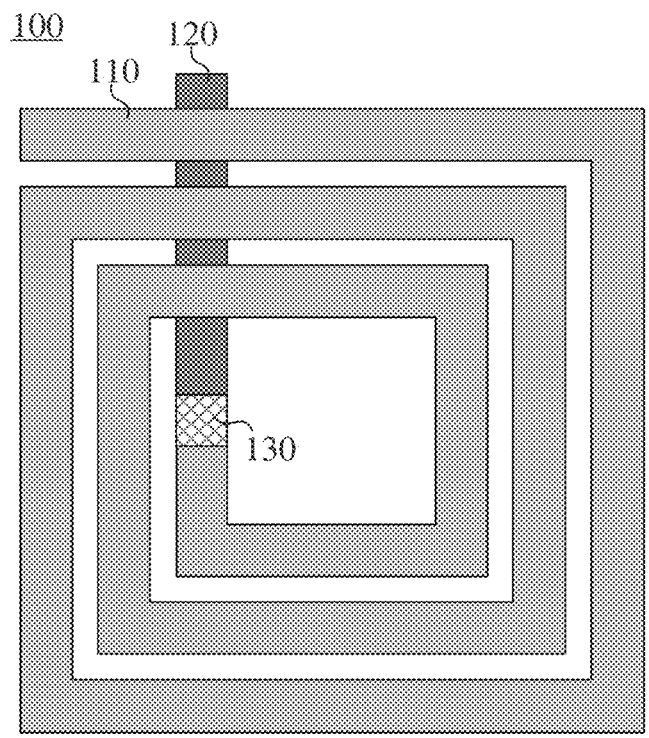
FIG. 1 illustrates a conventional asymmetric spiral inductor.
Figure 2:
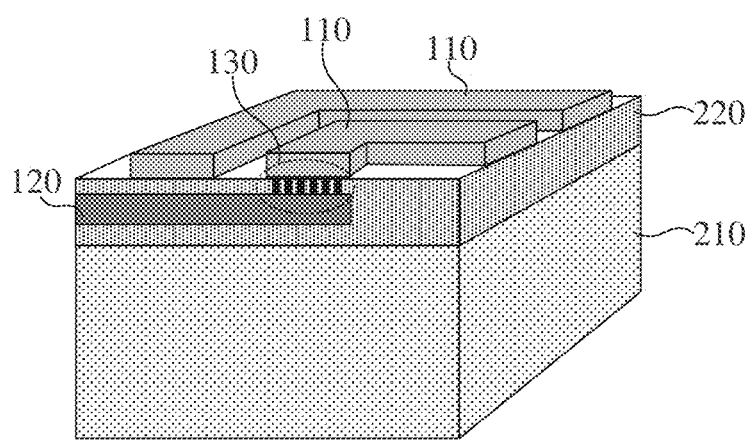
FIG. 2 illustrates a cross section of the asymmetric spiral inductor 100 in FIG. 1.
Figure 3:
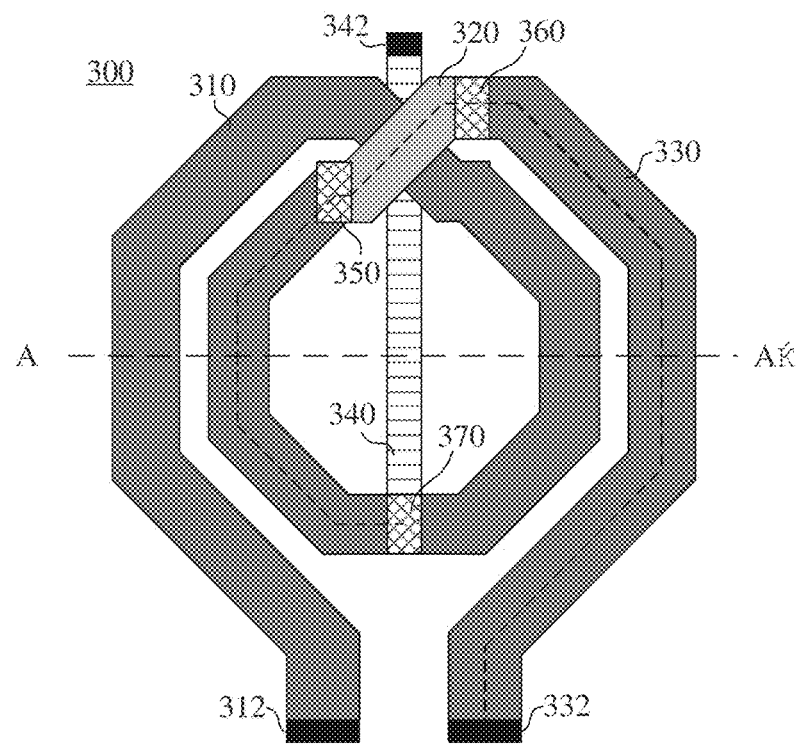
FIG. 3 illustrates a conventional symmetric spiral inductor.
Figure 6:
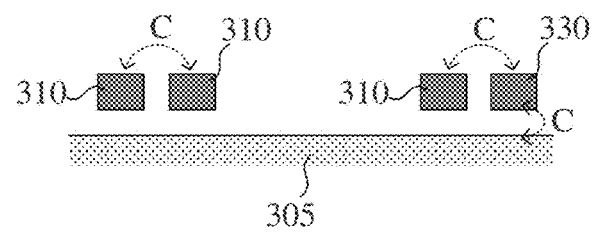
FIG. 6 illustrates a cross section of a conventional symmetric spiral inductor 300.
Figure 7:
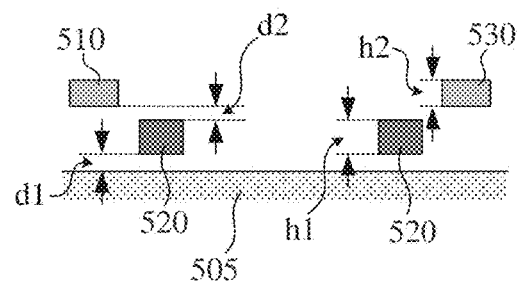
FIG. 7 illustrates a cross section of a symmetric spiral inductor 500 of the present invention.

The symmetric spiral inductor 500 also improves the bandwidth of the inductor by reducing the parasitic capacitance. Referring to FIGS. 3 and 6, the conventional symmetric spiral inductor 300 and its cross section are illustrated. In FIG. 6, only the metal segments and the substrate are shown and other parts, such as the oxide layer, are omitted for brevity. Because the metal segment 310 and the metal segment 330 of the conventional symmetric spiral inductor 300 are implemented on the same metal layer, the cross section corresponding to the dashed line A-A' shows that the metal segment 310 and the metal segment 330 have the same distance to the substrate 305. Because all the metal segments are on the same layer, the parasitic capacitance C tends to exist between metal segments. In addition, there is also parasitic capacitance between a metal segment and the substrate 305. Note that although only the parasitic capacitance between the metal segment 330 and the substrate 305 is shown in FIG. 6, the parasitic capacitance also exits between the metal segment 310 and the substrate 305. In comparison with the metal segments on the RDL, a parasitic capacitance is more easily generated between the metal segments on the UTM layer and the substrate because the UTM layer is closer to the substrate than the RDL. Referring to FIGS. 5 and 7, the symmetric spiral inductor 500 of the present invention and its cross section are illustrated. The metal segments of the symmetric spiral inductor 500 are distributed on at least two metal layers rather than being implemented on the same layer. The cross section in FIG. 7 corresponds to the dashed line A-A' in FIG. 5. It is obvious that the metal segment 510 and metal segment 530 are on the metal layer far from the substrate 505, whereas the metal segment 520 is on the metal layer close to the substrate 505. Under the premise that the horizontal distance between two adjacent metal segments remains unchanged, the parasitic capacitance between these two metal segments can be reduced due to an increased linear distance between the two metal segments as being implanted on different metal layers. The distance between the metal segment 520 and the substrate 505 is d1, and the vertical distance between the metal layer (with thickness h1) where the metal segment 520 resides and the metal layer (with thickness h2) where the metal segment 510 and the metal segment 530 reside is d2. For example, in a 28 nm process, the metal segment 520 implemented on the UTM layer has a thickness h1 of 3.4 μm and the distance d1 between it and the substrate 505 is 1.5 μm; the metal segment 510 implemented on the RDL has a thickness h2 of 2.8 μm and the distance d2 between it and the UTM layer is 0.8 μm. Namely, the distance d1=1.5 μm between the metal segment 520 and the substrate 505 is so small that a relatively large parasitic capacitance is expected; however, the distance between the metal segment 510 or the metal segment 530 and the substrate 505 is 5.7 μm (d1+h1+d2), which is 3.8 times the distance between the metal segment 520 and the substrate 505, so the parasitic capacitance between the metal segment 510 or the metal segment 530 and the substrate 505 is greatly reduced. In other words, by implementing some metal segments of the symmetric spiral inductor 500 on a different metal layer from other metal segments, such as in the aforementioned embodiment where the outer metal segments (i.e., the metal segment 510 and the metal segment 530) are implemented on the UDL while the inner metal segment (i.e., the metal segment 520) is implemented on the UTM layer, the overall parasitic capacitance of the integrated inductor can be reduced. Low parasitic capacitance is good for improving the quality factor Q and the bandwidth.

Figure 8:
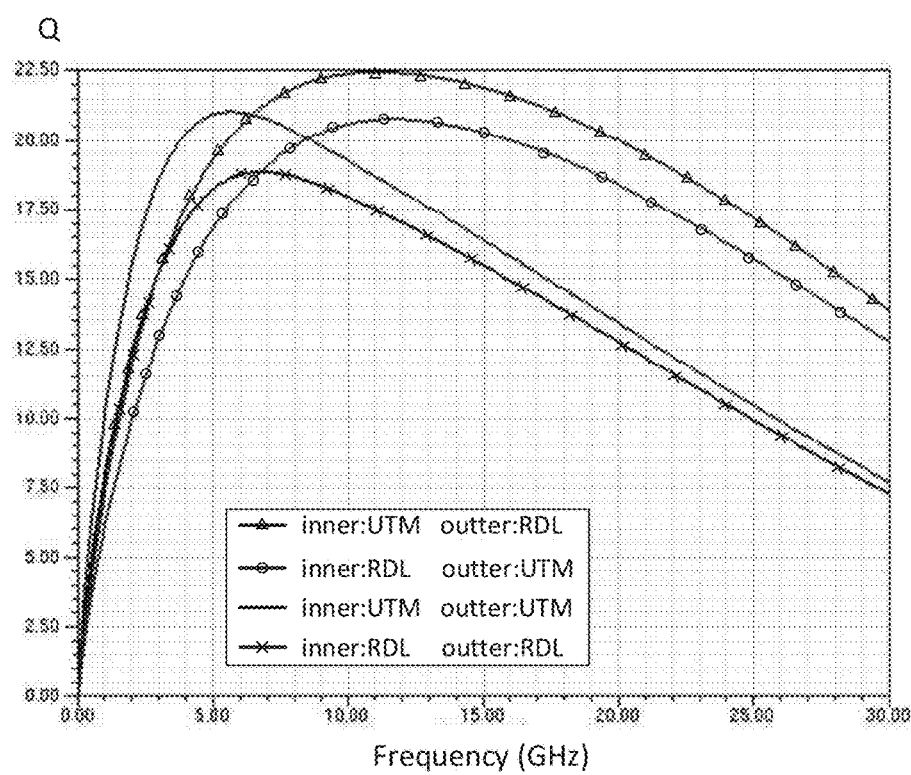
FIG. 8 illustrates a relationship between the quality factor Q and the frequency when an outer metal segment and an inner metal segment of a 2-turn symmetric spiral inductor are implemented on the same or different metal layer(s).

FIG. 8 shows a relationship between the quality factor Q and the frequency when an outer metal segment and an inner metal segment of a 2-turn symmetric spiral inductor are implemented on the same or different metal layer(s). This figure is a 28 nm process, the width of a metal segment is 22 μm, and the radius r of the integrated inductor (i.e., the distance from a center of the inductor to the inner side of the inner metal segment as shown in FIG. 5) is 45 μm. In the prior art, a higher quality factor Q can be achieved by implementing both the outer and inner metal segments on the UTM layer than implementing them on the RDL, but the bandwidths of both cases are small. In contrast, although the peak of the quality factor Q of implementing the inner/outer metal segment on the RDL/UTM respectively is slightly smaller than implementing both the inner and the outer metal segments on the UTM layer, the bandwidth is higher and the quality factor Q at high frequencies (>10 GHz) is better. Moreover, by implanting the inner/outer metal segment on the UTM/RDL respectively, better quality factor Q and greater bandwidth can be obtained; besides, a wide range of frequencies is achieved for quality factors Q greater than 20. Therefore, the integrated inductor of the present invention makes a great improvement in bandwidth in comparison with a conventional integrated inductor; further, the quality factor Q is greatly improved as well when the inner metal segment is implemented on the UTM layer while the outer metal segment on the RDL.

Figure 9:
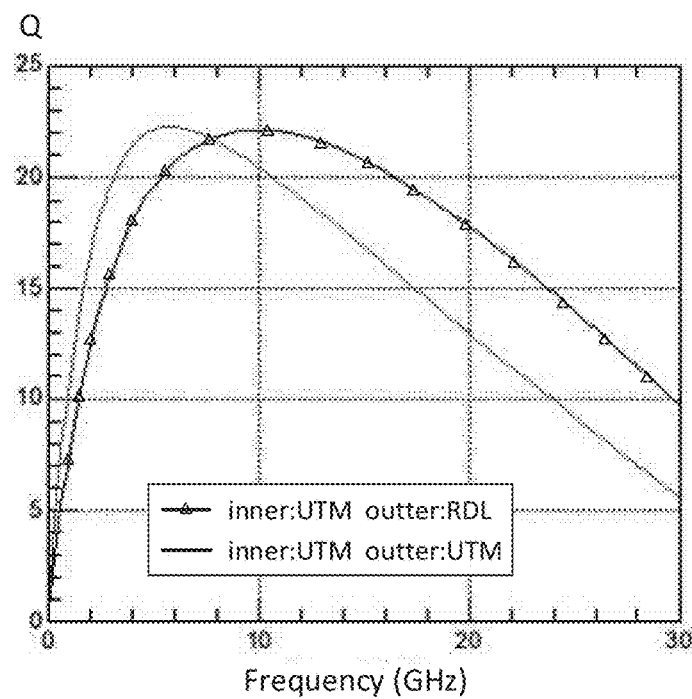
FIG. 9 illustrates a relationship between the quality factor Q and the frequency of the prior art and this invention in a 28 nm process with radius r=60 μm.
Figure 10:
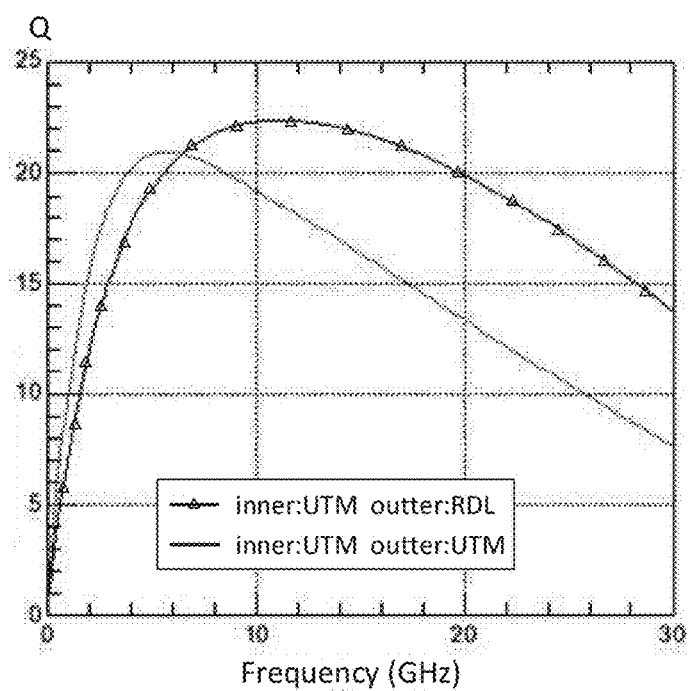
FIG. 10 illustrates a relationship between the quality factor Q and the frequency of the prior art and this invention in a 28 nm process with radius r=45 μm.
Figure 11:
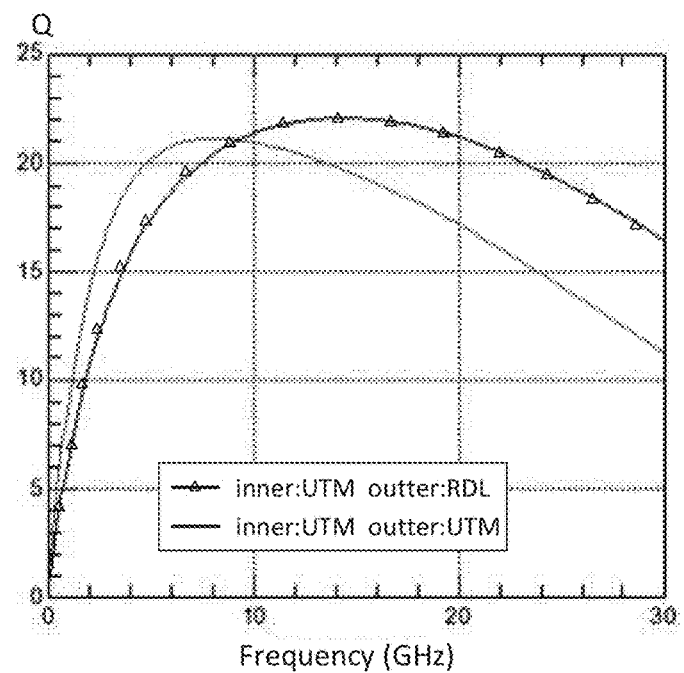
FIG. 11 illustrates a relationship between the quality factor Q and the frequency of the prior art and this invention in a 55 nm process with radius r=45 μm.

A comparison is made between an embodiment in the prior art (both the inner and outer metal segments on the UTM layer) and an embodiment of the present invention (the inner/outer metal segments on the UTM/RDL respectively) under different process parameters and radiuses, where the width of the metal segment is set to be 22 µm and the number of turns of the integrated inductor is 2. FIG. 9 illustrates a relationship between the quality factor Q and the frequency of the prior art and this invention in a 28 nm process with radius r=60 µm. It is observed that the peak of the quality factor Q of this invention is close to that of the prior art, but this invention obviously has a wider bandwidth (quality factors Q greater than 20 spreading over approximately 11 GHz). FIG. 10 illustrates a relationship between the quality factor Q and the frequency of the prior all and this invention in a 28 nm process with radius r=45 µm. It is obviously that the integrated inductor of this invention has better quality factor Q and bandwidth (quality factors Q greater than 20 spreading over approximately 14.2 GHz). In comparison with FIG. 9, the advantages of this invention can be better appreciated in integrated inductors with smaller radius. After several experiments, it is found that this invention has good performance when the radius is smaller than 50 µm. In other words, this invention comes up with a more practical implementation as the size of the integrated inductor becomes smaller, making the integrated inductors more adapted to miniaturized components operating in high frequencies. FIG. 11 illustrates a relationship between the quality factor Q and the frequency of the prior art and this invention in a 55 nm process with radius r=45 µm. In comparison with the prior art, the integrated inductor of this invention has greater quality factor Q and bandwidth (quality factors Q greater than 20 spreading over approximately 15.1 GHz). Although this embodiment has a slightly better bandwidth than that in FIG. 10, the quality factor Q is not as good as that in FIG. 10. In addition, FIG. 10 shows a better improvement to the prior art. In summary, the advantages of this invention are not easily perceived until the radius of the integrated inductor becomes smaller and the integrated inductor is manufactured in a more advanced process.

Figure 12:
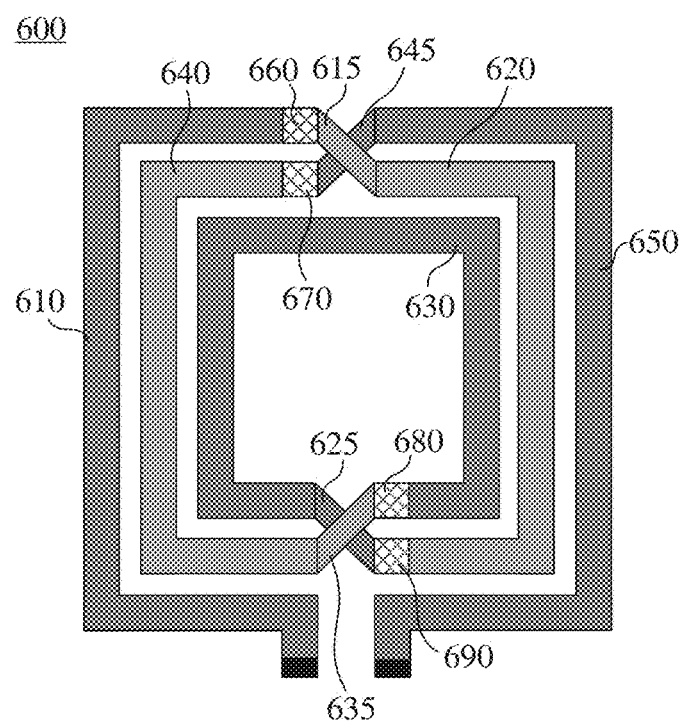
FIG. 12 illustrates another embodiment of the symmetric spiral inductor of this invention.

The principle of this invention can be extended to integrated inductors with more than 2 turns. FIG. 12 shows another embodiment of the symmetric spiral inductor of this invention. The symmetric spiral inductor 600 includes metal segments 610, 620, 630, 640 and 650, bridging metal segments 615, 625, 635 and 645, and connecting structures 660, 670, 680 and 690. The symmetric spiral inductor 600 has 3 turns and is of a rectangular shape while the embodiment of FIG. 5 is of an octagon shape; however, this invention is not limited to these two shapes. The outer part of the symmetric spiral inductor 600 includes the metal segment 610 and the metal segment 650, the middle part includes the metal segment 620 and the metal segment 640, and the inner part includes the metal segment 630. The metal segment 610 and the metal segment 620 are connected by the bridging metal segment 615. A terminal of the bridging metal segment 615 connects the metal segment 610 of a different layer via the connecting structure 660 and the other terminal connects the metal segment 620. Under some circumstances, the bridging metal segment 615 can be deemed as a part of the metal segment 620; in the specification, however, the bridging metal segment 615 and the metal segment 620 are defined to be distinct from each other in order to describe this invention more explicitly. The metal segment 630 connects the metal segment 620 and the metal segment 640 via the bridging metal segment 625 and the bridging metal segment 635, respectively. A terminal of the bridging metal segment 625 connects the metal segment 620 via the connecting structure 690 and the other terminal connects the metal segment 630. A terminal of the bridging metal segment 635 connects the metal segment 630 via the connecting structure 680, and the other connects the metal segment 640. The bridging metal segment 645 connects the metal segment 640 and the metal segment 650, with one terminal connecting the metal segment 640 via the connecting structure 670 and the other connects the metal segment 650 directly. In this embodiment, metal segments of two adjacent parts are implemented on different metal layers to reduce parasitic capacitance between metal segments. This embodiment can also be modified by implementing only the inner part on the UTM layer while implementing others on the RDL; as a result, the parasitic capacitance of the overall integrated inductor is reduced since the inner part which is sensitive to resistance is implemented on a thicker layer and most of the other metal segments are away from the substrate. As the embodiments of FIGS. 5 and 12 show, the metal segments of an integrated inductor structure with multiple turns are disposed on at least 2 different metal layers. On the contrary, the conventional integrated inductor structure in FIG. 3 has most of its metal segments, including the inner and outer metal segments, disposed on the same metal layer, except for the bridging metal segment 320. Moreover, although the integrated inductor structure of this invention can be implemented in even turns and odd turns, such as the 2-turn symmetric spiral inductor 500 and the 3-turn spiral inductor 600, integrated inductor structures with even turns can better show the advantages of symmetry of the present invention, in contrast to the conventional symmetric spiral inductor 300. It is because that in the conventional approach, a symmetric spiral inductor with odd turns has an even number of bridging metal segments, and therefore two inductors of the symmetric spiral inductor are able to improve their symmetry by containing the same number of connecting structures; however, this approach is not applicable to even turns since a symmetric spiral inductor with even turns has an odd number of bridging metal segments. In summary, in comparison with a conventional symmetric spiral inductor, the prevent invention presents an even better improvement in symmetry for an integrated inductor structure with even turns. However, whether the number of turns is even or odd, the integrated inductor structure of this invention makes its two inductors include the same number of connecting structures, which is important for the symmetry performance.

Figure 13:
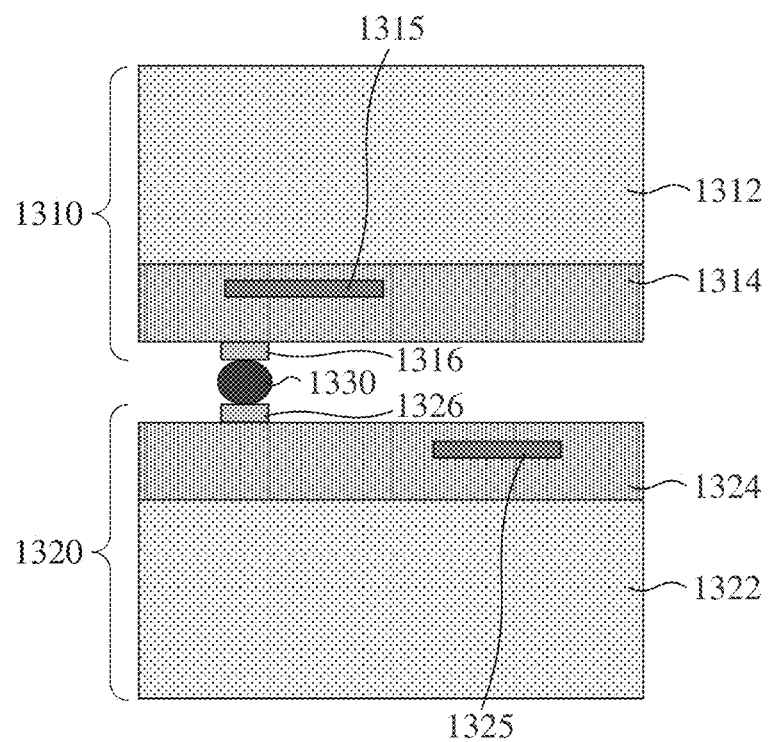
FIG. 13 illustrates a structure in which an integrated inductor is made on different metal layers according to an embodiment of this invention.

The metal layers used in this invention are not limited to the UTM layer and the RDL, which are adjacent; on the contrary, this invention can be implemented in a more complex semiconductor structure. FIG. 13 illustrates a structure in which an integrated inductor is made on different metal layers according to an embodiment of this invention. FIG. 13 shows a structure of a flip chip, including two dies 1310 and 1320 face to face. The die 1310 includes a substrate 1312, an oxide layer 1314 and a redistribution layer 1316. The oxide layer 1314 includes the ultra-thick metal 1315. The die 1320 includes a substrate 1322, an oxide layer 1324 and a redistribution layer 1326. The oxide layer 1324 includes the ultra-thick metal 1325. The oxide layers 1314 and 1324 may include other metal layers (not shown). In this embodiment, two metal layers of an integrated inductor can be respectively implemented on the redistribution layer 1316 and the redistribution layer 1326, and the connecting structure that connects different metal layers can be implemented by the micro-bump 1330. The surroundings of the micro-hump 1330 are filled with underfill to strengthen the structure of the flip chip. As the manufacturing process advances with smaller semiconductor components, the distance between the die 1310 and the die 1320 becomes smaller, which improves the stability of the integrated inductor structure.

Figure 14:
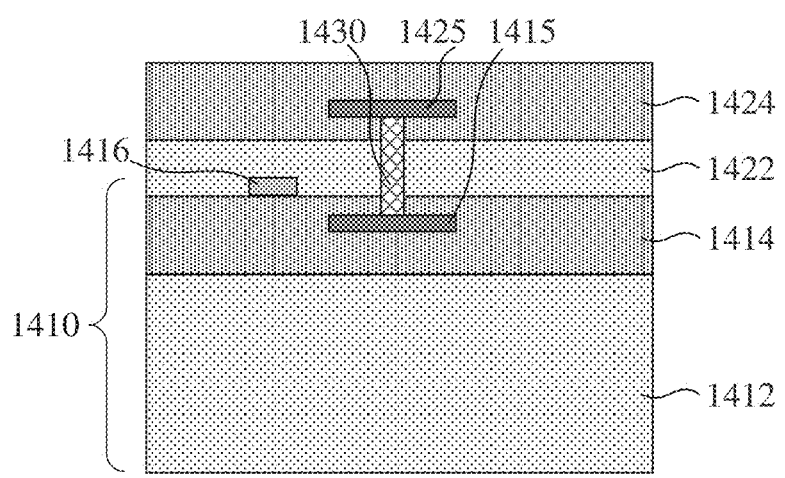
FIG. 14 illustrates a structure in which an integrated inductor is made on different metal layers according to another embodiment of this invention.

FIG. 14 illustrates a structure in which an integrated inductor is made on different metal layers according to another embodiment of this invention. The semiconductor structure includes a die 1410, which includes a substrate 1412, an oxide layer 1414 and a redistribution layer 1416. A substrate 1422 and an oxide layer 1424 are stacked on top of the die 1410. The oxide layer 1414 and the oxide layer 1424 respectively include a metal layer 1415 and a metal layer 1425. In this embodiment, the two metal layers of an integrated inductor can be implemented respectively on the metal layer 1415 and the metal layer 1425, and the connecting structure that connects different metal layers can be implemented by a TSV (through-silicon via) 1430, which is a via penetrating through a silicon layer and can be a single TSV or an array of TSVs. The metal layer 1415 and the metal layer 1425 can be made by the UTM layer or by a structure of other stacked metal layers in the oxide layer such as the metal layers M1, M2 and M3 connected in parallel. The number of metal layers of this kind is different in various manufacturing processes and is usually 3 to 11 layers. Metal layers of this kind are usually thin, such as 0.09 μm as opposed to 3.4 μm of the UTM layer in a 28 nm process; therefore these metal layers are connected in parallel to reduce resistance.

Figure 15:
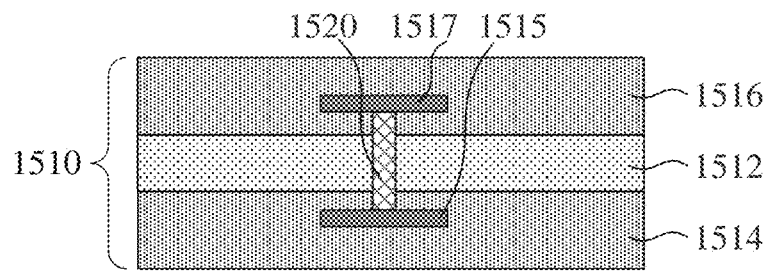
FIG. 15 illustrates a structure in which an integrated inductor is made on different metal layers according to another embodiment of this invention.

FIG. 15 illustrates a structure in which an integrated inductor is made on different metal layers according to another embodiment of this invention. This semiconductor structure includes a die 1510, which includes an oxide layer 1514, a substrate 1512 and an oxide layer 1516. The oxide layer 1514 and the oxide layer 1516 respectively include the metal layer 1515 and the metal layer 1517, and are respectively the front side and the back side of the die 1510. In this embodiment, the two metal layers of an integrated inductor can be implemented respectively on the metal layer 1515 and the metal layer 1517, and the connecting structure that connects different metal layers can be implemented by a TSV 1520. Likewise, the metal layer 1515 and the metal layer 1517 can be made by the UTM layer or by a structure of other stacked metal layers in the oxide layer connected in parallel. The through-silicon via 1520 can be a single TSV or an array of TSVs. In addition to connecting the outer metal segments and the inner metal segments, the through-silicon via can also be used as a connecting structure that connect the outer/inner metal segments with the center tap.

Figure 16:
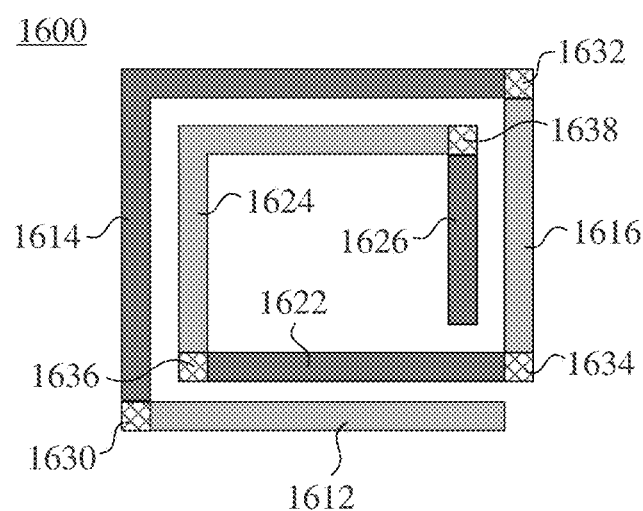
FIG. 16 illustrates an asymmetric spiral inductor according to an embodiment of the present invention.

In addition to symmetric spiral inductor, this invention can also be applied to asymmetric spiral inductor. FIG. 16 illustrates an asymmetric spiral inductor according to an embodiment of the present invention. This embodiment only shows a spiral inductor with 2 turns as an example, but this invention can be applied to a spiral inductor with more turns. An asymmetric spiral inductor 1600 includes metal segments 1612, 1614, 1616, 1622, 1624 and 1626. The metal segments 1612, 1614 and 1616 form an outer part of the asymmetric spiral inductor 1600 and the metal segments 1622, 1624 and 1626 form an inner part. Specifically, because the metal segments 1614 has a turning point in a rectangular angle (can be different angles in other embodiments), the metal segments 1614 can be regarded as a combination of two metal sub-segments. Metal segments at the corresponding positions of the outer part and the inner part are disposed on different metal layers to reduce the parasitic capacitance between adjacent metal segments; to be specific, the corresponding metal segments 1612 and 1622 are on different layers, the corresponding metal segments 1614 and 1624 are on different layers, and the corresponding metal segments 1616 and 1626 are on different layers. If both the outer part and the inner part are circular, only one segment is included in each part, and the metal segment in the outer part and the metal segment in the inner part are corresponding metal segments and are therefore disposed on different metal layers according to this invention. In addition, different metal segments are connected by connecting structures; for example, the connecting structure 1630 connects the metal segment 1612 and the metal segment 1614, the connecting structure 1632 connects the metal segment 1614 and the metal segment 1616, the connecting structure 1634 connects the metal segment 1616 and the metal segment 1622, the connecting structure 1636 connects the metal segment 1622 and the metal segment 1624, and the connecting structure 1638 connects the metal segment 1624 and the metal segment 1626.

Figure 17:
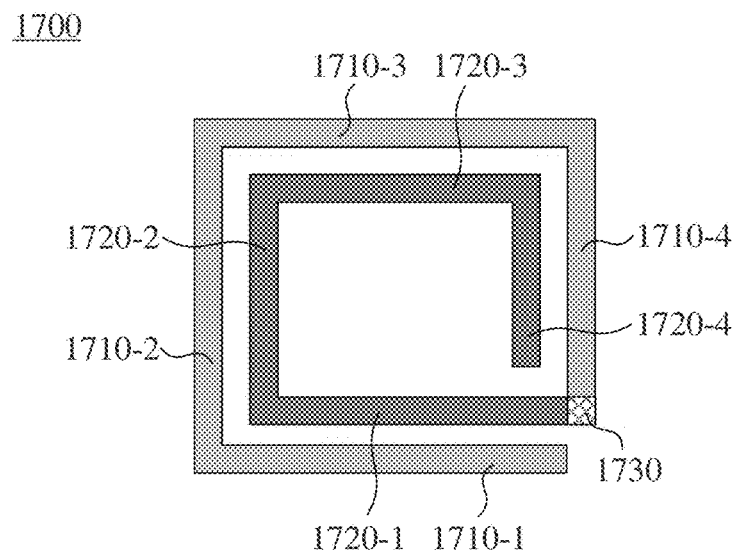
FIG. 17 illustrates an asymmetric spiral inductor according to another embodiment of the present invention.

FIG. 17 illustrates an asymmetric spiral inductor according to another embodiment of the present invention. This embodiment shows a spiral inductor with only 2 turns as an example, but this invention can be applied to a spiral inductor with more turns. The asymmetric spiral inductor 1700 includes a metal segment 1710 (in light gray color) and metal segment 1720 (in dark gray color). The metal segment 1710 constitutes an outer part of the asymmetric spiral inductor 1700 and the metal segment 1720 constitutes an inner part of the asymmetric spiral inductor 1700. In other words, metal segments of two adjacent turns are disposed on different metal layers. Specifically, because the metal segment 1710 has 3 turning points in rectangular angles (can be different angles in other embodiments), the metal segment 1710 can be regarded as a combination of 4 metal sub-segments 1710-1~1710-4. Likewise, the metal segment 1720 can be regarded as a combination of 4 metal sub-segments 1720-1~1720-4. The metal segment 1710-1 (1710-2, 1710-3, 1710-4) corresponds to the metal segment 1720-1 (1720-2, 1720-3, 1720-4) and are disposed on different metal layers. In one embodiment, the thickness of the metal segment 1710 is smaller than that of the metal segment 1720 so that the metal segment 1720, namely the inner part of the asymmetric spiral inductor 1700, has a smaller resistance; for example, the metal segment 1710 is implemented on the RDL while the metal segment 1720 is implemented on the UTM layer. If, however, there is a third metal segment in the area surrounded by the metal segment 1720, the third metal segment is not on the same layer as the metal segment 1720; for example, it can be implemented on the same layer as the metal segment 1710 or on a third metal layer. The metal segment 1710 and the metal segment 1720 are connected by the connecting structure 1730. In this embodiment, the parasitic capacitance between two adjacent metal segments is reduced by implementing metal segments of two adjacent turns on different metal layers and thus the quality factor Q and the bandwidth of an integrated inductor can be improved.

Figure 18:
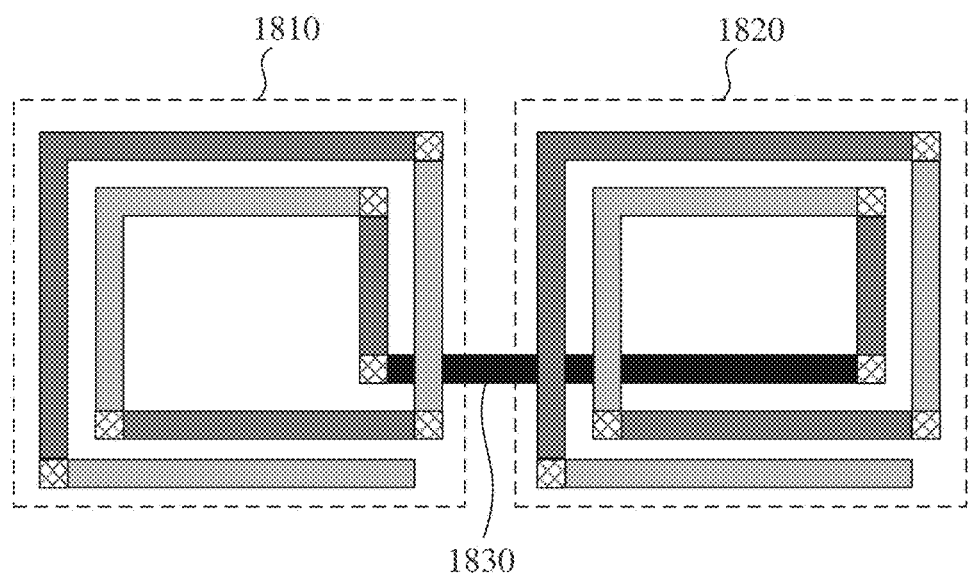
FIG. 18 illustrates connected asymmetric spiral inductors according to an embodiment of this invention.
Figure 19:
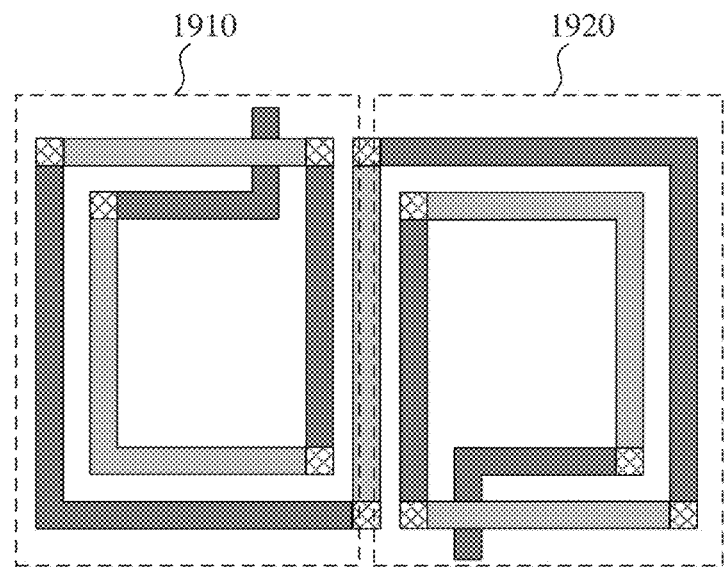
FIG. 19 illustrates connected asymmetric spiral inductors according to another embodiment of this invention.
Figure 20:
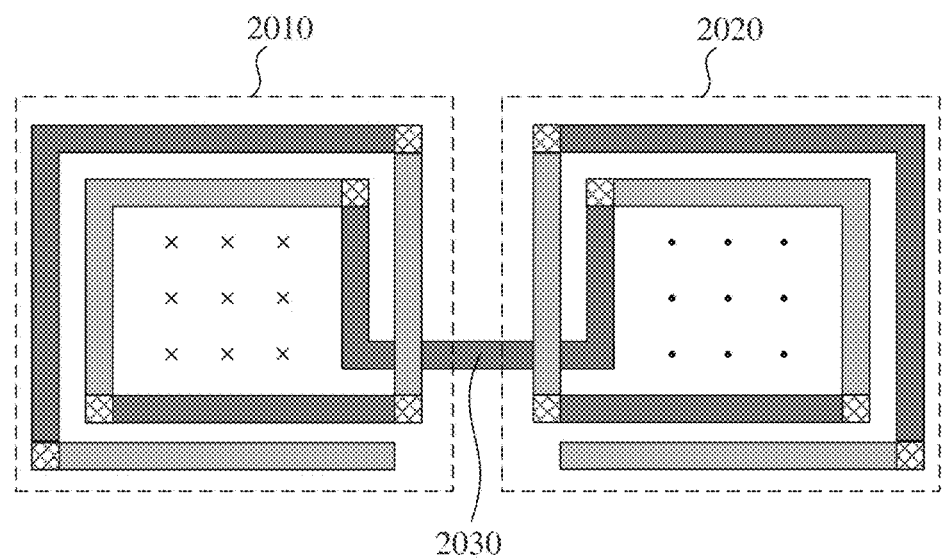
FIG. 20 illustrates connected asymmetric spiral inductors according to another embodiment of this invention.

A pair of integrated inductors that can be used as the inductor 410 and the inductor 420 of the VCO in FIG. 4 can be formed based on a combination of the asymmetric spiral inductors 1600 or the asymmetric spiral inductors 1700. Taking the asymmetric spiral inductor 1600 as an example. FIG. 18 illustrates connected asymmetric spiral inductors according to an embodiment of this invention. The asymmetric spiral inductor 1810 and the asymmetric spiral inductor 1820 are connected via the metal segment 1830. Since the symmetry between the asymmetric spiral inductor 1810 and the asymmetric spiral inductor 1820 is very good, a center tap (not shown) can be connected with the metal segment 1830 so that the current in each asymmetric spiral inductor flows through equal number and length of metal segments and equal number of connecting structures; as a result, the connected spiral inductors shown in FIG. 18 is quite suitable for the inductors in a differential circuit. Further, FIG. 19 illustrates connected asymmetric spiral inductors according to another embodiment of this invention. The asymmetric spiral inductor 1910 and the asymmetric spiral inductor 1920 share one metal segment and the center tap (not shown) can be connected with the shared metal segment so that the current in each asymmetric spiral inductor flows through equal number and length of metal segments and equal number of connecting structures; as a result, the connected spiral inductors shown in FIG. 19 is also quite suitable for the inductors in a differential circuit. However, whether the connected asymmetric spiral inductors of FIG. 18 or the connected asymmetric spiral inductors of FIG. 19, the currents in the two connected asymmetric spiral inductors flow in the same direction (both clockwise or counterclockwise), which causes the radiation of magnetic field that affects other components in the circuit. The radiation of magnetic field can be greatly reduced by adjusting the connection of the asymmetric spiral inductors. FIG. 20 illustrates connected asymmetric spiral inductors according to another embodiment of this invention. The asymmetric spiral inductor 2010 and the asymmetric spiral inductor 2020 are mirror structures and are connected by the metal segment 2030. A center tap (not shown) can be connected to the metal segment 2030. Most magnetic field, as indicated by dots and x's in the figure, is confined in the connected asymmetric spiral inductors because the current in the asymmetric spiral inductor 2010 flows clockwise whereas the current in the asymmetric spiral inductor 2020 flows counterclockwise. Therefore, components in a compact integrated circuit are free of interference from the radiation of magnetic field.

Figure 21:
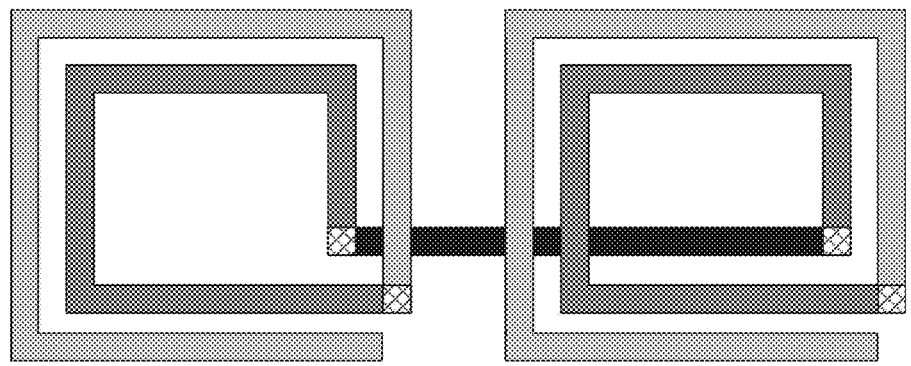
FIG. 21 illustrates connected asymmetric spiral inductors according to another embodiment of this invention.
Figure 22:
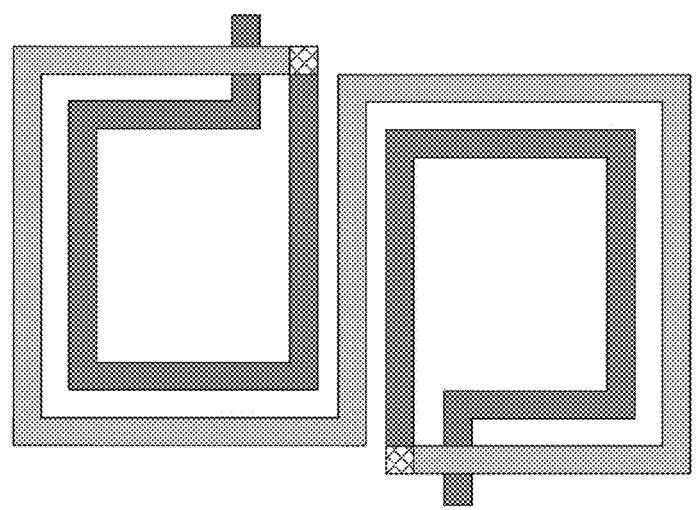
FIG. 22 illustrates connected asymmetric spiral inductors according to another embodiment of this invention.
Figure 23:
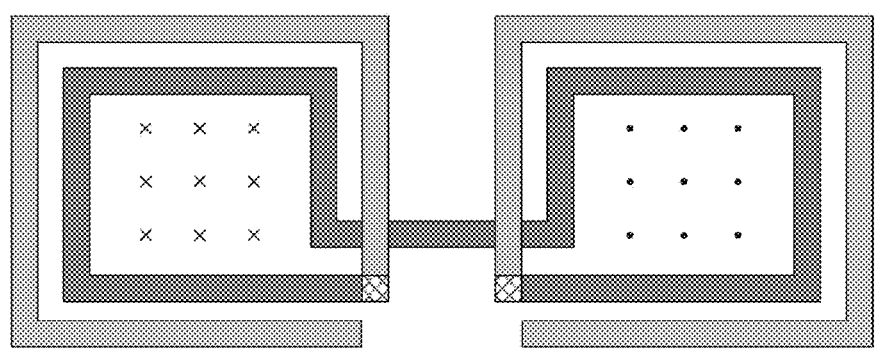
FIG. 23 illustrates connected asymmetric spiral inductors according to another embodiment of this invention.

In addition to the asymmetric spiral inductor 1600 in FIG. 16, the connected structure of the asymmetric spiral inductor in FIGS. 18~20 can be implemented by the asymmetric spiral inductor 1700 as well, as shown in FIGS. 21~23. In addition, the asymmetric spiral inductors in FIGS. 16 and 17 can also be implemented by the semiconductor structures in FIGS. 13~15.

The shape, size, and ratio of any element in the disclosed figures are just exemplary for understanding, not for limiting the scope of this invention. The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:

1. An integrated inductor structure, comprising:
    an outer metal segment, comprising a first metal sub-segment and a second metal sub-segment;
    an inner metal segment which is in an area surrounded by the outer metal segment and comprises a third metal sub-segment and a fourth metal sub-segment; and
    at least a connecting structure for connecting the outer metal segment and the inner metal segment;
    wherein, the first metal sub-segment and the third metal sub-segment correspond to each other and belong to different metal layers of a semiconductor structure, and the second metal sub-segment and the fourth metal sub-segment correspond to each other and belong to different metal layers of the semiconductor structure;
    wherein, the metal segments on different metal layers belong to different dies and the connecting structure is a micro bump.

2. The integrated inductor structure of claim 1, wherein the first metal sub-segment and the third metal sub-segment are parallel, and the second metal sub-segment and the fourth metal sub-segment are parallel.

3. The integrated inductor structure of claim 1, wherein the first metal sub-segment and the second metal sub-segment belong to different metal layers of the semiconductor structure and are connected by a first additional connecting structure, and the third metal sub-segment and the fourth metal sub-segment belong to different metal layers of the semiconductor structure and are connected by a second additional connecting structure.

4. The integrated inductor structure of claim 1, wherein all the metal sub-segments of the outer metal segment are on a first metal layer of the semiconductor structure, and all the metal sub-segments of the inner metal segment are on a second metal layer of the semiconductor structure, and the first metal layer is different from the second metal layer.

5. The integrated inductor structure of claim 4, wherein a thickness of the first metal layer is smaller than a thickness of the second metal layer.

6. The integrated inductor structure of claim 1, wherein the metal segments on different metal layers are in a first oxide layer and a second oxide layer respectively, a silicon layer is disposed between the first oxide layer and the second oxide layer, and the connecting structure is a through-silicon via.

7. The integrated inductor structure of claim 6, wherein the first oxide layer, the silicon layer and the second oxide layer form a die, and the first oxide layer and the second oxide layer are the front side and the back side of the die, respectively.

8. The integrated inductor structure of claim 1 being an asymmetric spiral inductor structure.

* * * * *